(12) United States Patent
Chu et al.

(10) Patent No.: US 10,802,070 B2
(45) Date of Patent: Oct. 13, 2020

(54) TESTING DEVICE AND TESTING METHOD WITH SPIKE PROTECTION

(71) Applicant: CHROMA ATE INC., Tao-Yuan (TW)

(72) Inventors: Ching-Hua Chu, Tao-Yuan (TW); Cheng-Hsien Chang, Tao-Yuan (TW)

(73) Assignee: CHROMA ATE INC., Tao-Yuan (TW)

( * ) Notice: Subject to any disclaimer, the term of this patent is extended or adjusted under 35 U.S.C. 154(b) by 288 days.

(21) Appl. No.: 15/955,668

(22) Filed: Apr. 17, 2018

(65) Prior Publication Data

US 2018/0306856 A1  Oct. 25, 2018

(30) Foreign Application Priority Data

Apr. 20, 2017  (TW) .............................. 106113324 A (51) Int. Cl.
*G01R 31/28* (2006.01)
*G01R 1/36* (2006.01)

(52) U.S. Cl.
CPC ........... *G01R 31/2879* (2013.01); *G01R 1/36* (2013.01); *G01R 31/2882* (2013.01)

(58) Field of Classification Search
CPC ... G01R 31/2879; G01R 1/36; G01R 31/2882
USPC ...................... 324/750.01; 323/272
See application file for complete search history.

(56) References Cited

U.S. PATENT DOCUMENTS

| 5,455,502 A | * | 10/1995 | Kato | ........................ | G01R 1/36 323/272 |
| 6,703,827 B1 | * | 3/2004 | Wolf | ...................... | G01D 3/022 324/207.12 |
| 7,719,814 B2 | | 5/2010 | Kobayashi et al. | | |
| 2005/0212505 A1 | | 9/2005 | Murray et al. | | |
| 2009/0089725 A1 | | 4/2009 | Khan | | |

FOREIGN PATENT DOCUMENTS

| CN | 1652061 A | 8/2005 |
| CN | 2837859 Y | 11/2006 |
| CN | 101155457 A | 4/2008 |
| CN | 106208028 A | 12/2016 |
| JP | 2000-148258 A | 5/2000 |
| JP | 2004-326994 A | 11/2004 |
| JP | 2007034839 A | 2/2007 |
| JP | 4246498 B2 | 4/2009 |
| JP | 2012-058050 A | 3/2012 |
| JP | 2012-78287 A | 4/2012 |
| TW | 200845557 A | 11/2008 |

(Continued)

*Primary Examiner* — Farhana A Hoque
(74) *Attorney, Agent, or Firm* — CKC & Partners Co., LLC (57) ABSTRACT

A testing device includes a switch, a sensing circuit, and a control circuit. The switch is coupled to a power supply circuit, and the power supply circuit is configured to output a supply voltage to a device under-test via the switch. The sensing circuit is coupled to the device under-test, and the sensing circuit is configured to receive an input voltage from the device under-test and to output a sensing signal according to the input voltage. The control circuit is coupled to the sensing circuit, the power supply circuit, and the switch. The control circuit is configured to control the power supply circuit to stop outputting the supply voltage at a first time and to turn off the switch at a second time according to the sensing signal.

20 Claims, 4 Drawing Sheets

(56) References Cited

FOREIGN PATENT DOCUMENTS

| | | | |
|---|---|---|---|
| TW | 201104414 A | 2/2011 |
| TW | 201136449 A | 10/2011 |
| TW | 201507318 A | 2/2015 |
| TW | 201523005 A | 6/2015 |

\* cited by examiner

TESTING DEVICE AND TESTING METHOD WITH SPIKE PROTECTION

RELATED APPLICATIONS

This application claims priority to Taiwan Application Serial Number 106113324, filed Apr. 20, 2017, which is herein incorporated by reference.

BACKGROUND

Technical Field

The present disclosure relates to a testing technology. More particularly, the present disclosure relates to a testing device and a testing method with spike protection.

Description of Related Art

In testing of an integrated chip (IC), a testing device is employed to run related tests on a device under-test (DUT). However, if a spike was generated during the testing process, negative impacts on the IC would be introduced. In some situations, the IC may be damaged by the spike. Obviously, there are inconveniences and defects in current approaches, which need to be improved.

SUMMARY

An aspect of the present disclosure is to provide a testing device with spike protection. The testing device includes a switch, a sensing circuit, and a control circuit. The switch is coupled to a power supply circuit, and the power supply circuit is configured to output a supply voltage to a device under-test via the switch. The sensing circuit is coupled to the device under-test, and the sensing circuit is configured to receive an input voltage from the device under-test and to output a sensing signal according to the input voltage. The control circuit is coupled to the sensing circuit, the power supply circuit, and the switch, and the control circuit is configured to control the power supply circuit to stop outputting the supply voltage at a first time and to turn off the switch at a second time according to the sensing signal.

An aspect of the present disclosure is to provide a testing method with spike protection. The testing method includes the following operations: outputting, by a power supply circuit of a testing device, a supply voltage to a device under-test via a switch; receiving, by a sensing circuit of the testing device, an input voltage from the testing device; outputting, by the sensing circuit, a sensing signal according to the input voltage; and controlling, by a control circuit of the testing device, the power supply circuit to stop outputting the supply voltage at a first time and to turn off the switch at a second time according to the sensing signal.

As described above, the testing device controls the power supply circuit to stop outputting the supply voltage at a first time, and to turn off the switch, which is used for transmitting the supply voltage to the device under-test, at a second time. With such arrangement, negative impacts on the device under-test can be prevented.

BRIEF DESCRIPTION OF THE DRAWINGS

This disclosure can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

As used herein, the terms "comprising," "including," "having," "containing," "involving," and the like are to be understood to be open-ended, i.e., to mean including but not limited to.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, if a switch is described to be turned on, it may indicate that a current flows through two terminals of the switch. Alternatively, if a switch is described to be turned off, it may indicate that no current (or a small amount of current (e.g., leakage current)) flows through two terminals of the switch.

Figure 1:
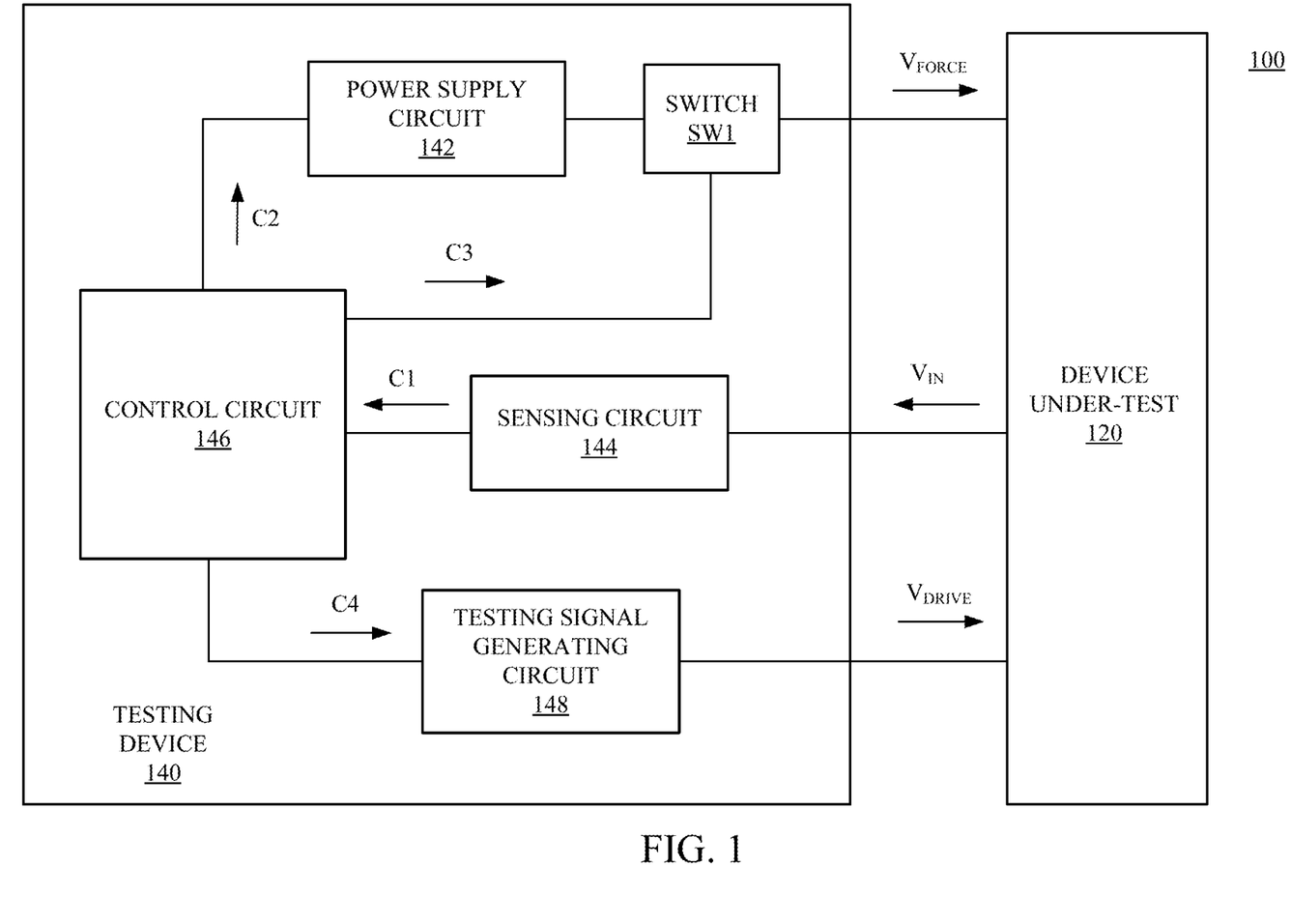
FIG. 1 is a schematic diagram of a testing system, according to some embodiments of the present disclosure.

Reference is made to FIG. 1. FIG. 1 is a schematic diagram of a testing system 100, according to some embodiments of the present disclosure. In some embodiments, the testing system 100 includes a device under-test 120 and a testing device 140.

In some embodiments, the device under-test 120 includes a circuit under-test. Various circuits to implement the circuit under-test are within the contemplated scope of the present disclosure.

In some embodiments, the testing device 140 is configured to output a testing signal $V_{DRIVE}$ to the device under-test 120, in order to run various tests on the device under-test 120. In some embodiments, the testing signal $V_{DRIVE}$ is a digital testing signal. In some embodiments, the testing device 140 is a testing device with spike protection.

In some embodiments, the testing device 140 includes a power supply circuit 142, a sensing circuit 144, a control circuit 146, and a switch SW1. In some further embodiments, the testing device 140 further includes a testing signal generating circuit 148.

As illustratively shown in FIG. 1, the power supply circuit 142 is coupled to the switch SW1. The control circuit 146 is coupled to the switch SW1, the power supply circuit 142, the sensing circuit 144, and the testing signal generating circuit 148. The switch SW1 is coupled to the device under-test 120. The sensing circuit 144 is coupled to the device under-test 120. The testing signal generating circuit 148 is coupled to the device under-test 120.

As a result, the power supply circuit 142 is able to output a supply voltage $V_{FORCE}$ to the device under-test 120 via the switch SW1. The sensing circuit 144 is able to receive an input voltage $V_{IN}$ from the device under-test 120. The testing signal generating circuit 148 is able to provide the testing signal $V_{DRIVE}$ to the device under-test 120.

In some embodiments, the device under-test 120 receives the supply voltage $V_{FORCE}$ and operates according to the supply voltage $V_{FORCE}$. In some embodiments, the device under-test 120 generates an input voltage $V_{IN}$ according to the supply voltage $V_{FORCE}$. For example, the circuit under-test of the device under-test 120 may include a resistor. The supply voltage $V_{FORCE}$ is transmitted to one terminal of the resistor, and another terminal of the resistor generates the input voltage $V_{IN}$ correspondingly. In some embodiments, a voltage difference between the supply voltage $V_{FORCE}$ and the input voltage $V_{IN}$ is associated with a resistance value of the resistor. For example, the voltage difference between the supply voltage $V_{FORCE}$ and the input voltage $V_{IN}$ is directly proportional to the resistance value of the resistor.

The relation between the supply voltage $V_{FORCE}$ and the input voltage $V_{IN}$ is given for illustrative purposes only. Various relations between the supply voltage $V_{FORCE}$ and the input voltage $V_{IN}$ are within the contemplated scope of the present disclosure.

In some embodiments, the sensing circuit 144 generates a sensing signal C1 according to the input voltage $V_{IN}$. Then, the control circuit 146 controls the power supply circuit 142, the switch SW1, and the testing signal generating circuit 148 according to the sensing signal C1. In some embodiments, the control circuit 146 outputs a control signal C2 according to the sensing signal C1. The power supply circuit 142 stops outputting the supply voltage $V_{FORCE}$ at a first time (e.g., time T1 in FIG. 3) according to the control signal C2. In some embodiments, the control circuit 146 outputs a control signal C3 according to the sensing signal C1. The switch SW1 is turned off at a second time (e.g., time T2 in FIG. 3) according to the control signal C3. In some embodiments, time T2 is later than time T1.

With the testing device 140, the power of the power supply circuit 142 is turned off at time T1, and the switch SW1 is turned off at time T2. As a result, negative impacts, introduced from the spikes, on the device under-test 120 are able to be prevented.

In some embodiments, the control circuit 146 further outputs a control signal C4 according to the sensing signal C1. The testing signal generating circuit 148 stops outputting the testing signal $V_{DRIVE}$ to the device under-test 120 according to the control signal C4.

In some embodiments, the control circuit 146 may be implemented with a controller chip, a controller, or other hardware-based circuits having a controller function. Various circuits to implement the control circuit 146 are within the contemplated scope of the present disclosure.

Figure 2:
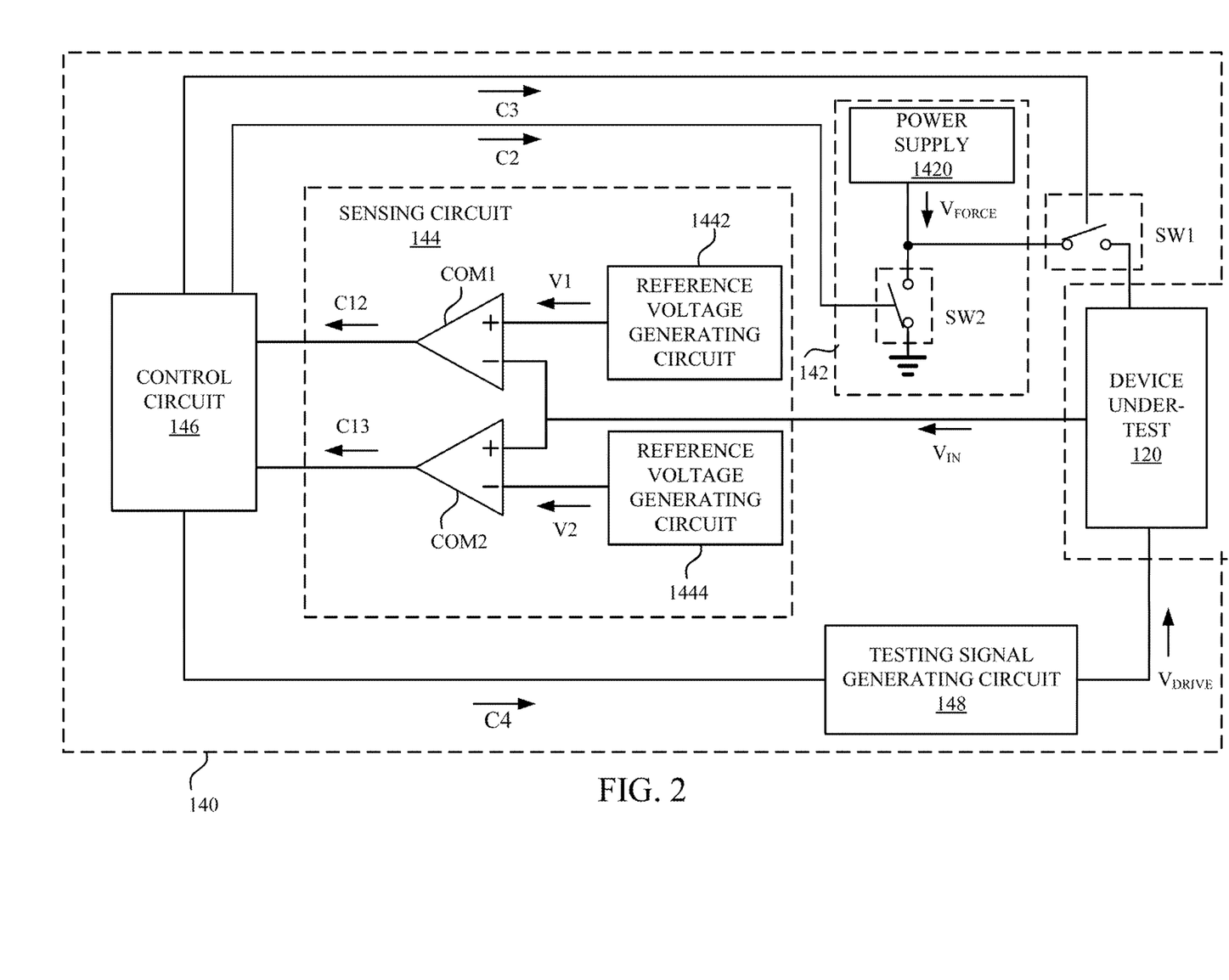
FIG. 2 is a detailed schematic diagram illustrating the testing system in FIG. 1, according to some embodiments of the present disclosure.
Figure 3:
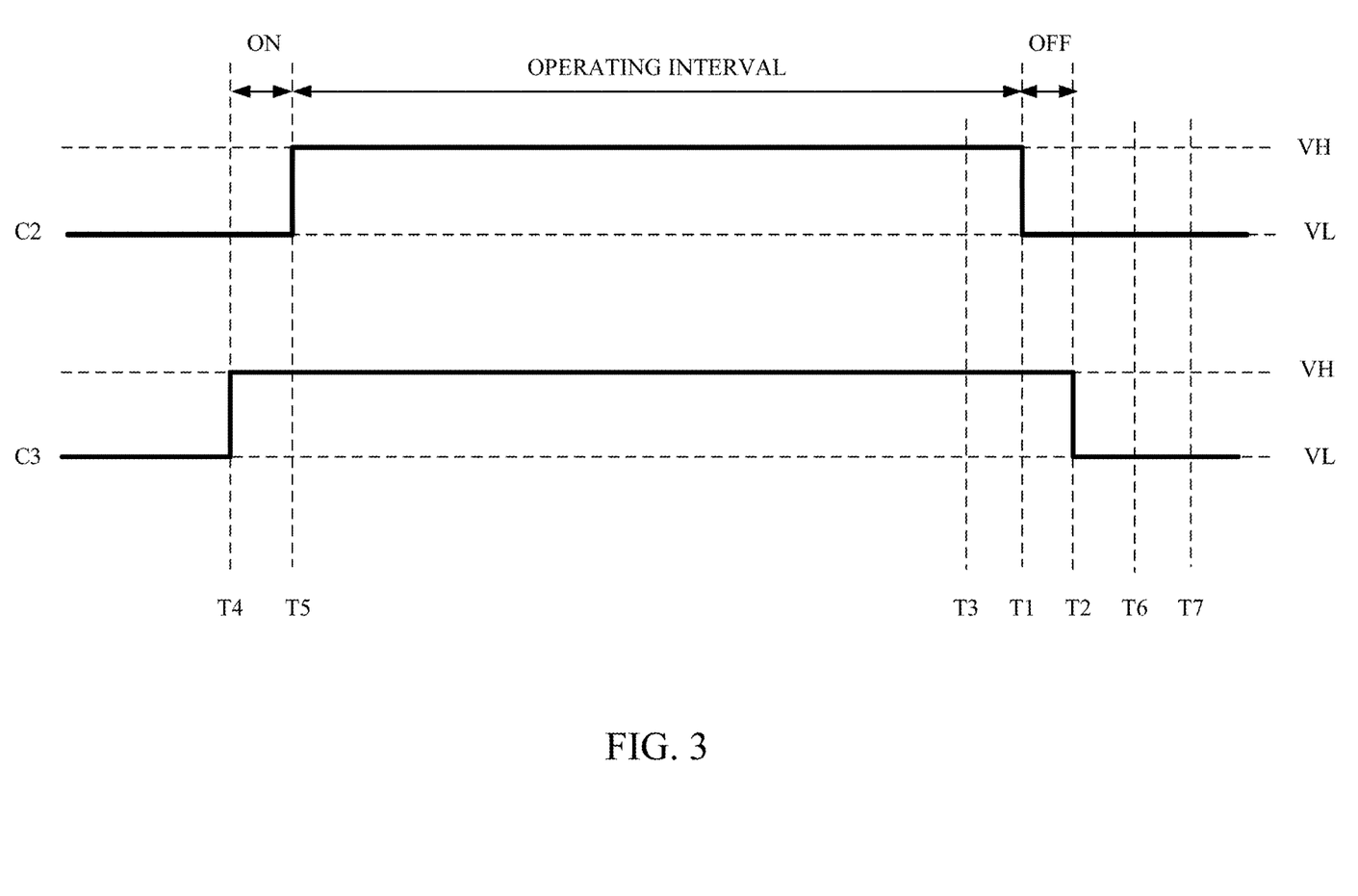
FIG. 3 is a timing diagram illustrating the control signals in FIG. 1, according to some embodiments of the present disclosure.

Reference is now made to FIGS. 2-3. FIG. 2 is a detailed schematic diagram illustrating the testing system 100 in FIG. 1 according to some embodiments of the present disclosure. For ease of understanding, like elements in FIG. 2 are designated with the same reference numbers with respect to FIG. 1.

In some embodiments, the sensing circuit 144 includes a reference voltage generating circuit 1442, a reference voltage generating circuit 1444, a comparator COM1, and a comparator COM2. Two input terminals of the comparator COM1 are coupled to the reference voltage generating circuit 1442 and the device under-test 120, respectively. An output terminal of the comparator COM1 is coupled to the control circuit 146. Two input terminals of the comparator COM2 are coupled to the reference voltage generating circuit 1444 and the device under-test 120, respectively. An output terminal of the comparator COM2 is coupled to the control circuit 146.

In some embodiments, the reference voltage generating circuit 1442 provides a reference voltage V1 to an input terminal (e.g., a positive input terminal) of the comparator COM1. A second input terminal (e.g., a negative input terminal) of the comparator COM1 receives the input voltage $V_{IN}$ from the device under-test 120. Accordingly, the comparator COM1 compares the reference voltage V1 with the input voltage $V_{IN}$. In some embodiments, the reference voltage V1 is a negative voltage. In some embodiments, if the input voltage $V_{IN}$ is lower than the reference voltage V1 (e.g., a spike), the comparator COM1 outputs a sensing signal C12 having a logic value of 1 to the control circuit 146 via the output terminal thereof.

In some embodiments, a first input terminal (e.g., a positive input terminal) of the comparator COM2 receives the input voltage $V_{IN}$ from the device under-test 120. The reference voltage generating circuit 1444 provides a reference voltage V2 to a second input terminal (e.g., a negative input terminal) of the comparator COM2. Accordingly, the comparator COM2 compares the reference voltage V2 with the input voltage $V_{IN}$. In some embodiments, the reference voltage V2 is a positive voltage. In some embodiments, if the input voltage $V_{IN}$ is higher than the reference voltage V2 (e.g., a spike), the comparator COM2 outputs a sensing signal C13 having the logic value of 1 to the control circuit 146 via the output terminal thereof.

The implementations of the sensing circuit 144 are given for illustrative purposes. Various implementations of the sensing circuit 144 are within the contemplated scope of the present disclosure. Furthermore, in some embodiments, the voltage value of the reference voltage V1 or that of the reference voltage V2 is able to be adjusted according to practical requirements.

In some embodiments, the control circuit 146 outputs the control signal C2 to the power supply circuit 142 according to the sensing signal C12 having the logic value of 1 or the sensing signal C13 having the logic value of 1, in order to control the power supply circuit 142. In some embodiments, the control circuit 146 outputs the control signal C3 to a control terminal (e.g., a gate terminal) of the switch SW1 according to sensing signal C12 having the logic value of 1 or the sensing signal C13 having the logic value of 1, in order to control the switch SW1. Accordingly, the switch SW1 is controlled with the control signal C3 to be turned on or off. In some embodiments, the control circuit 146 outputs a control signal C4 to the testing signal generating circuit 148 according to the sensing signal C12 having the logic value of 1 or the sensing signal C13 having the logic value of 1, in order to control the testing signal generating circuit 148.

In some embodiments, the power supply circuit 142 includes a power supply 1420 and a switch SW2. The switch SW2 is coupled between an output terminal of the power supply 1420 and a ground terminal. The power supply 1420 is configured to generate the supply voltage $V_{FORCE}$. The switch SW2 is controlled by the control signal C2 to be turned on or off.

In some embodiments, the switch SW1 is implemented with at least one N-type metal-oxide-semiconductor field-effect transistor (MOSFET). Accordingly, if the control signal C3 is at a high voltage VH (e.g., the voltage corresponding to the logic value of 1), the switch SW1 is turned on. If the control signal C3 is at a low voltage VL (e.g., the voltage corresponding to the logic value of 0), the switch SW1 is turned off.

In some embodiments, the switch SW2 is implemented with at least one P-type MOSFET. Accordingly, if the control signal C2 is at the high voltage VH, the switch SW2 is turned off. If the control signal C2 is at the low voltage VL, the switch SW2 is turned on.

The types of the switch SW1 and the switch SW2 are given for illustrative purposes. Various components able to implement the switch SW1 and the switch SW2 are within the contemplated scope of the present disclosure. For examples, these transistors may be bipolar junction transistors (BJT) or insulated gate bipolar transistors (IGBT). In addition, the logic values of the control signal C3 and the control signal C2 may be correspondingly adjusted according to the types of the switch SW1 and the switch SW2, respectively.

The implementations of the power supply circuit 142 are given for illustrative purposes. Various implementations of the power supply circuit 142 are within the contemplated scope of the present disclosure.

Reference is now made to FIG. 3. FIG. 3 is a timing diagram illustrating the control signals C2 and C3 in FIG. 1, according to some embodiments of the present disclosure. For ease of understanding, FIG. 3 is described with reference to FIG. 2, but the present disclosure is not limited thereto.

At time T4, the control signal C3 is transited from the low voltage VL to the high voltage VH. Accordingly, the switch SW1 is turned on.

From time T4 to time T5, the control signal C2 is at the low voltage VL, and the control signal C3 is at the high voltage VH. Accordingly, the switch SW2, as well as the switch SW1, is turned on. Thus, the supply voltage $V_{FORCE}$ outputted from the power supply 1420 is pulled down to ground via the switch SW2. In other words, the power supply circuit 142 does not output the supply voltage $V_{FORCE}$ to the device under-test 120.

At time T5, the control signal C2 is transited from the low voltage VL to the high voltage VH. From time T5 to time T1, the control signal C2, as well as the control signal C3, is at the high voltage VH. Accordingly, the switch SW2 is turned off, and the switch SW1 is turned on. Thus, the supply voltage $V_{FORCE}$ outputted from the power supply 1420 is transmitted to the device under-test 120 via the switch SW1. In other words, the operating interval of the testing system 100 is a time interval between time T5 and time T1.

With the testing device 140, the switch SW1 is turned on at time T4, and the power supply circuit 142 outputs the supply voltage $V_{FORCE}$ to the device under-test 120 at time T5. As a result, negative impacts, introduced from spikes, on the device under-test 120 are able to be prevented. In some embodiments, a time interval between time T4 and time T5 is 0.4 milliseconds (ms)-0.6 ms.

At time T1, the control signal C2 is transited from the high voltage VH to the low voltage VL. From time T1 to time T2, the control signal C2 is at the low voltage VL, and the control signal C3 is at the high voltage VH. Accordingly, the switch SW2, as well as the switch SW1, is turned on. Thus, the supply voltage $V_{FORCE}$ outputted from the power supply 1420 is pulled down to ground via the switch SW2. As a result, the power supply circuit 142 stops outputting the supply voltage $V_{FORCE}$ to the device under-test 120.

At time T2, the control signal C3 is transited from the high voltage VH to the low voltage VL. Accordingly, the switch SW1 is turned off.

With the testing device 140, the power supply circuit 142 stops outputting the supply voltage $V_{FORCE}$ to the device under-test 120 at time T1, and the switch SW1 is turned off at time T2. As a result, negative impacts, introduced from spikes of the testing device 140, on the device under-test 120 are able to be prevented. In some embodiments, a time interval between time T1 and time T2 is 1 ms-10 ms.

In some embodiments, the testing signal generating circuit 148 outputs the testing signal $V_{DRIVE}$ to the device under-test 120, in order to run various tests on the device under-test 120. In some embodiments, the testing signal generating circuit 148 stops outputting the testing signal $V_{DRIVE}$ at time T3 according to the control signal C4. In some embodiments, time T3 is earlier than time T1. In other words, the control circuit 146 controls the testing signal generating circuit 148 to stop outputting the testing signal $V_{DRIVE}$ at first (i.e., operation at time T3), and then controls the power supply circuit 142 to stop outputting the supply voltage $V_{FORCE}$ (i.e., operation at time T1). Afterward the control circuit 146 turns off the switch SW1 (i.e., operation at time T2). With separation times, negative impacts, introduced from spikes, on the device under-test 120 are able to be prevented.

In some embodiments, the testing device 140 is configured to run test on a plurality of devices under-test. For example, the testing device 140 is configured to run tests on a first device under-test (e.g., the device under-test 120) and a second device under-test (not shown). In some embodiments, the testing device 140 stops outputting the testing signal $V_{DRIVE}$ to the second device under-test at time T6, and stops outputting the supply voltage $V_{FORCE}$ to the second device under-test at time T7. In some embodiments, time T6 is later than time T2, and time T7 is later than time T6. With separation times, negative impacts, introduced from spikes, on these devices under-test are able to be prevented.

Figure 4:
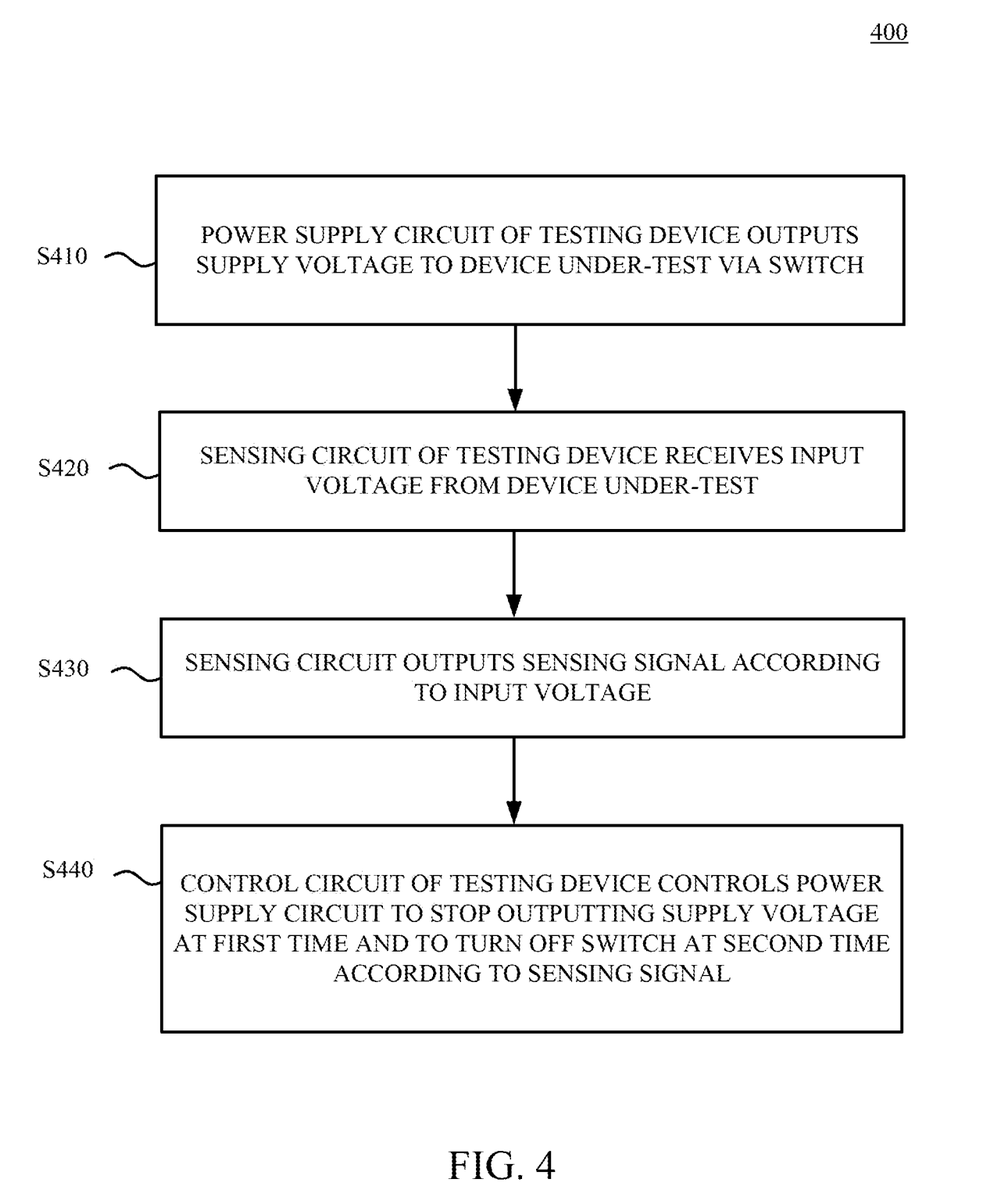
FIG. 4 is a flow chart of a testing method, according to some embodiments of the present disclosure.

Reference is now made to FIG. 4. FIG. 4 is a flow chart of a testing method 400, according to some embodiments of the present disclosure. In some embodiments, the testing method 400 is applied to the testing system 100 in FIG. 1. The testing method 400 includes operations S410, S420, S430, and S440. For ease of understanding, the testing method 400 is illustrated with reference to the testing system 100 in FIG. 1, but the present disclosure is not limited thereto.

In operation S410, the power supply circuit 142 of the testing device 140 outputs the supply voltage $V_{FORCE}$ to the device under-test 120 via the switch SW1.

In operation S420, the sensing circuit 144 of the testing device 140 receives the input voltage $V_{IN}$ from the device under-test 120.

In operation S430, the sensing circuit 144 outputs the sensing signal C1 according to the input voltage $V_{IN}$.

In operation S440, the control circuit 146 of the testing device 140 controls the power supply circuit 142 to stop outputting the supply voltage $V_{FORCE}$ at time T1 and to turn off the switch SW1 at time T2 according to the sensing signal C1. In some embodiments, time T2 is later than time T1.

The above description of the testing method 400 includes exemplary operations, but the operations of the testing method 400 are not necessarily performed in the order described. The order of the operations of the testing method 400 are able to be changed, or the operations are able to be executed simultaneously or partially simultaneously, or the operations are able to be omitted partially as appropriate, in accordance with the spirit and scope of various embodiments of the present disclosure.

As described above, the testing device controls the power supply circuit to stop outputting the supply voltage at a first time, and to turn off the switch, which is used for transmitting the supply voltage to the device under-test, at a second time. With such arrangement, negative impacts, introduced from spikes, on the device under-test can be prevented.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A testing device with spike protection, comprising:
    a first switch coupled to a power supply circuit, the power supply circuit configured to output a supply voltage to a device under-test via the first switch, wherein the power supply circuit comprises a power supply and a second switch, wherein the first switch is directly coupled to the second switch and the power supply;
    a sensing circuit coupled to the device under-test, the sensing circuit configured to receive an input voltage from the device under-test and to output a sensing signal according to the input voltage; and
    a control circuit coupled to the sensing circuit, the power supply circuit, the first switch, and the second switch, the control circuit configured to output a control signal to control the second switch to be turned on or turned off to control the power supply circuit to stop outputting the supply voltage at a first time and to turn off the first switch at a second time according to the sensing signal.

2. The testing device of claim 1, wherein the second time is later than the first time.

3. The testing device of claim 1, wherein a time interval between the first time and the second time is 1-10 milliseconds (ms).

4. The testing device of claim 1, wherein the sensing circuit comprises:
    a first comparator coupled to the device under-test, the first comparator is configured to compare the input voltage with a first reference voltage, and if the input voltage is lower than the first reference voltage, the control circuit turns off the first switch according to the sensing signal.

5. The testing device of claim 4, wherein the first reference voltage is a negative voltage.

6. The testing device of claim 4, wherein the sensing circuit further comprises:
    a second comparator coupled to the device under-test, the second comparator is configured to compare the input voltage with a second reference voltage, and if the input voltage is higher than the second reference voltage, the control circuit turns off the first switch according to the sensing signal.

7. The testing device of claim 6, wherein the second reference voltage is a positive voltage.

8. The testing device of claim 1, further comprising:
    a testing signal generating circuit coupled to the control circuit, the testing signal generating circuit configured to output a testing signal to the device under-test, wherein the control circuit is further configured to control the testing signal generating circuit to stop outputting the testing signal at a third time according to the sensing signal, and the third time is earlier than the first time.

9. The testing device of claim 8, wherein the first switch is turned off after the testing signal generating circuit stops outputting the testing signal.

10. The testing device of claim 8, wherein the first switch is turned on before the power supply circuit outputs the supply voltage to the device under-test.

11. A testing method with spike protection, comprising:
    outputting, by a power supply circuit of a testing device, a supply voltage to a device under-test via a first switch, wherein the power supply circuit comprises a power supply and a second switch, wherein the first switch is directly coupled to the second switch and the power supply;
    receiving, by a sensing circuit of the testing device, an input voltage from the testing device;
    outputting, by the sensing circuit, a sensing signal according to the input voltage; and
    controlling, by a control signal from a control circuit of the testing device, the second switch to be turned on or turned off to control the power supply circuit to stop outputting the supply voltage at a first time and to turn off the first switch at a second time according to the sensing signal.

12. The testing method of claim 11, wherein the second time is later than the first time.

13. The testing method of claim 11, wherein a time interval between the first time and the second time is 1-10 milliseconds (ms).

14. The testing method of claim 11, wherein outputting, by the sensing circuit, the sensing signal according to the input voltage comprises:
    comparing, by a first comparator of the sensing circuit, the input voltage with a first reference voltage; and
    turning, by the control circuit, off the first switch according to the sensing signal if the input voltage is lower than the first reference voltage.

15. The testing method of claim 14, wherein the first reference voltage is a negative voltage.

16. The testing method of claim 14, wherein outputting, by the sensing circuit, the sensing signal according to the input voltage further comprises:
    comparing, by a second comparator of the sensing circuit, the input voltage with a second reference voltage; and turning, by the control circuit, off the first switch according to the sensing signal if the input voltage is higher than the second reference voltage.

17. The testing method of claim 16, wherein the second reference voltage is a positive voltage.

18. The testing method of claim 11, further comprising:
controlling, by the control circuit, a testing signal generating circuit to stop outputting a testing signal to the device under-test at a third time according to the sensing signal, wherein the third time is earlier than the first time.

19. The testing method of claim 18, wherein the first switch is turned off after the testing signal generating circuit stops outputting the testing signal.

20. The testing method of claim 18, wherein the first switch is turned on before the power supply circuit outputs the supply voltage to the device under-test.

* * * * *